US008283947B1

(12) United States Patent
Ubaradka et al.

(10) Patent No.: US 8,283,947 B1
(45) Date of Patent: Oct. 9, 2012

(54) HIGH VOLTAGE TOLERANT BUS HOLDER CIRCUIT AND METHOD OF OPERATING THE CIRCUIT

(75) Inventors: Jayarama Ubaradka, Bangalore (IN); Dharmaray M. Nedalgi, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/152,764

(22) Filed: Jun. 3, 2011

(51) Int. Cl.
*H03K 19/0175* (2006.01)
(52) U.S. Cl. ............................ 326/81; 326/58; 326/83
(58) Field of Classification Search .............. 326/56–58, 326/62–63, 68, 80–83, 86–87; 710/302, 710/304
See application file for complete search history.

(56) References Cited

U.S. PATENT DOCUMENTS

| | | | | |
|---|---|---|---|---|
| 5,635,860 A * | 6/1997 | Westerwick | | 326/81 |
| 5,973,530 A | 10/1999 | Morris et al. | | |
| 6,049,242 A * | 4/2000 | Lutley et al. | | 327/333 |
| 6,060,906 A * | 5/2000 | Chow et al. | | 326/81 |
| 7,304,511 B2 * | 12/2007 | Kawano | | 327/108 |
| 7,768,299 B2 * | 8/2010 | Gupta et al. | | 326/38 |
| 2001/0015656 A1 * | 8/2001 | Tsuji | | 326/57 |
| 2005/0189963 A1 * | 9/2005 | Uno | | 326/81 |
| 2006/0181315 A1 | 8/2006 | Choi et al. | | |
| 2009/0066367 A1 * | 3/2009 | Wang et al. | | 326/80 |
| 2009/0108870 A1 * | 4/2009 | Wang et al. | | 326/68 |

* cited by examiner

Primary Examiner — Shawki S Ismail
Assistant Examiner — Jany Tran

(57) ABSTRACT

A high voltage tolerant bus holder circuit and method of operating the bus holder circuit utilizes first and second control transistors connected in parallel between a control terminal of a pull-up transistor and a bus. The first control transistor is used to turn on the pull-up transistor during a pull-up mode of operation. The second control transistor is used to turn off the pull-down transistor when a voltage on the bus exceeds a threshold.

20 Claims, 6 Drawing Sheets

HIGH VOLTAGE TOLERANT BUS HOLDER CIRCUIT AND METHOD OF OPERATING THE CIRCUIT

A bus holder circuit is a weak inverter circuit used in input/output (UO) circuits to hold a tri-stated bus to a required valid logic level. A typical bus holder circuit includes a pull-up transistor and a pull-down transistor to pull-up or pull-down the voltage on a tri-stated bus when needed. The bus holder circuit prevents floating nodes when the nodes are connected to tri-stated bus. Otherwise, both the pull-up and pull-down transistors could get turned on, thus shorting power supply to ground, which would result in unwanted power dissipation.

As the semiconductor process for fabricating devices is scaled down, the maximum tolerable voltages across terminal are decreased to ensure proper lifetime operation. However, to comply with legacy devices, the circuits built with different semiconductor processing technologies need to interface with systems with different voltages, which can be achieved by bus holder circuits.

Various bus holder circuits have been developed with high voltage tolerance to better interface with different systems. However, these conventional high voltage tolerant bus holder circuits have many disadvantages. For example, some of the conventional high voltage tolerant bus holder circuits (1) consumes static current when the voltage on the target bus is high, (2) are not suitable for low power applications, and/or (3) require at least one device that need additional processing steps, which increases manufacturing cost.

Thus, there is a need for a high voltage tolerant bus holder circuit and method of operating the circuit that does not have at least some of these disadvantages.

A high voltage tolerant bus holder circuit and method of operating the bus holder circuit utilizes first and second control transistors connected in parallel between a control terminal of a pull-up transistor and a bus. The first control transistor is used to turn on the pull-up transistor during a pull-up mode of operation. The second control transistor is used to turn off the pull-down transistor when a voltage on the bus exceeds a threshold.

In an embodiment, a bus holder circuit comprises first and second pull-up transistors, a first pull-down transistor and first and second control transistors. The first and second pull-up transistors are connected in series on a first current path between a bus and a high voltage rail. The first pull-down transistor is on a second current path between the bus and a low voltage rail. The first and second control transistors are connected in parallel between a control terminal of the second pull-up transistor and the bus. The first control transistor is used to turn on the second pull-up transistor during a pull-up mode of operation. The second control transistor is used to turn off the second pull-up transistor when a voltage on the bus exceeds a threshold. The bus holder circuit may further include a second pull-down transistor connected in series with the first pull-down transistor on the second current path between the bus and the first pull-down transistor.

In an embodiment, a method of operating a bus holder circuit comprises turning on first and second pull-up transistors connected in series on a first current path between a bus and a high voltage rail during a pull-up mode of operation of the bus holder circuit using a first control transistor connected to a control terminal of the second pull-up transistor and the bus, turning on a first pull-down transistor on a second current path between the bus and a low voltage rail during a pull-down mode of operation of the bus holder circuit, and turning off the second pull-down transistor when a voltage on the bus exceeds a threshold using a second control transistor connected in parallel with the first control transistor between the control terminal of the second pull-up transistor and the bus.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
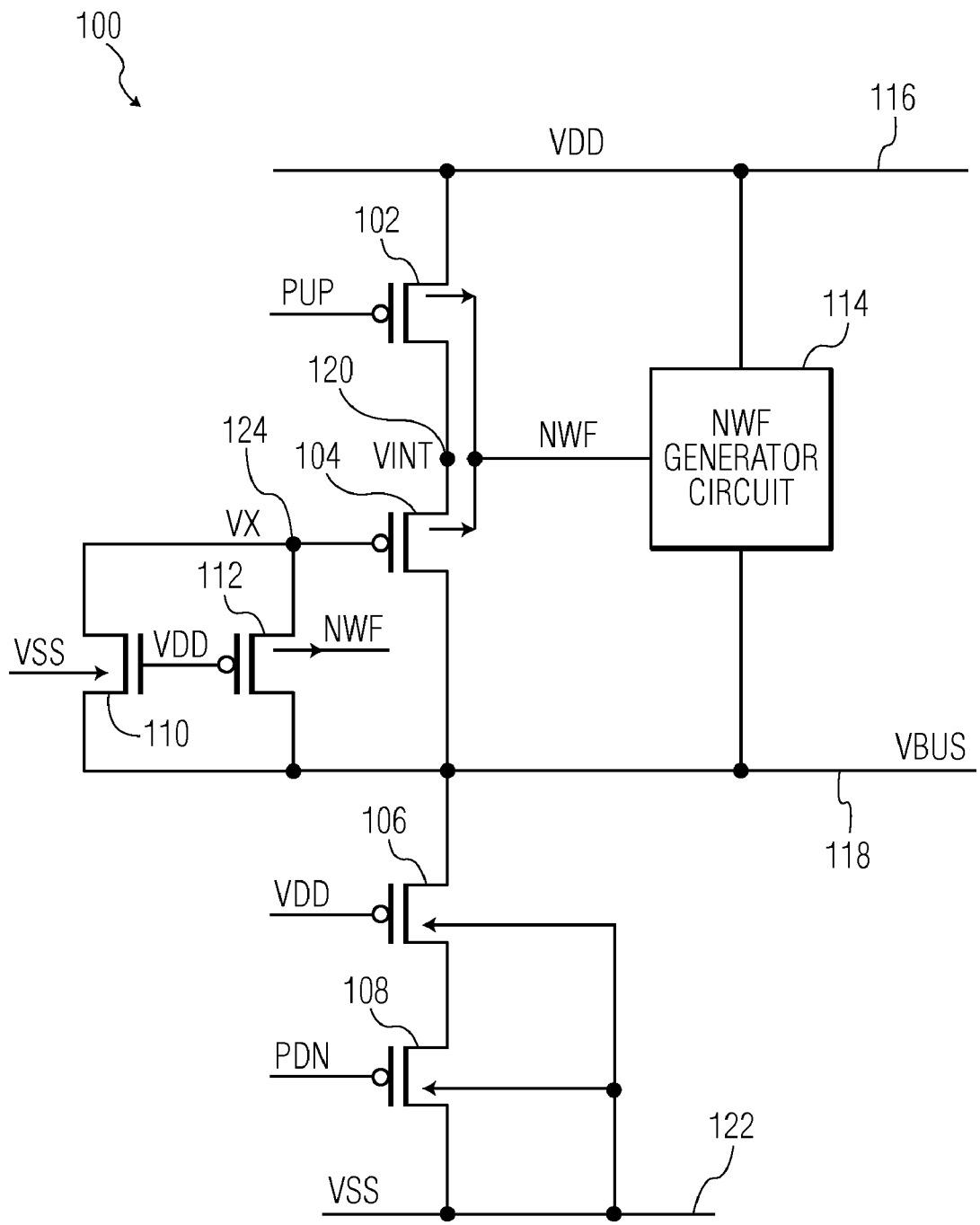
FIG. 1 is a schematic diagram of a high voltage tolerant bus holder circuit in accordance with an embodiment of the invention.

Turning now to FIG. 1, a high voltage tolerant bus holder circuit 100 in accordance with an embodiment of the invention is shown. The bus holder circuit is simple in design and implementation. In addition, the bus holder circuit is high voltage tolerant for both the states of pull-up control signal and the disable state of pull-down control signal, configurable in different operational modes, and configured to limit gate-oxide stress and hot carrier degradation. Furthermore, the bus holder circuit is realizable in base line Complementary Metal Oxide Semiconductor (CMOS) process technology without requirement of any specific process options, and thus, does not incur additional manufacturing cost. Lastly, the bus holder circuit does not consume static current.

As shown in FIG. 1, the bus holder circuit 100 includes two series-connected P-Channel Metal Oxide Semiconductor (PMOS) pull-up transistors 102 and 104, two series-connected N-Channel Metal Oxide Semiconductor (NMOS) pull-down transistors 106 and 108, two parallel-connected control transistors 110 and 112 and an n-well floating (NWF) generator circuit 114. The PMOS pull-up transistors 102 and 104 are connected in series on a first current path between a high supply voltage rail 116 and a bus 118 such that the PMOS pull-up transistor 102 is connected between the supply voltage rail and the PMOS pull-up transistor 104 via a node 120, and the PMOS pull-up transistor 104 is connected between the PMOS pull-up transistor 102 and the bus 118. In the illustrated embodiment, the high supply voltage rail 116 provides a positive supply voltage (VDD). The NMOS pull-down transistors 106 and 108 are connected in series on a second current path between the bus 118 and a low supply voltage rail 122, which may be electrical ground, such that the NMOS pull-down transistor 106 is connected between the bus and the NMOS pull-down transistor 108, and the NMOS pull-down transistor 108 is connected between the NMOS pull-down transistor 106 and the low supply voltage rail. In the illustrated embodiment, the low supply voltage rail provides a negative supply voltage (VSS). Although the transistors 102, 104, 106, 108, 110 and 112 are shown and described as being either PMOS or NMOS transistors, these transistors may be another type of transistors in other embodiments, such as bipolar transistors.

The gate or control terminal of the PMOS pull-up transistor 102 is connected to an external controller (not shown) to receive a pull-up (PUP) signal. The gate or control terminal of the NMOS pull-down transistor 108 is also connected to the external controller to receive a pull-down (PDN) signal. The gate or control terminal of the NMOS pull-down transistor 106 is connected to the high supply voltage rail 116 to receive VDD. The gate or control terminal of the PMOS pull-up transistor 104 is connected to both of the parallel-connected control transistors 110 and 112.

The substrates (or bodies) of the PMOS pull-up transistors 102 and 104 are connected to an output of the NWF generator circuit 114 to receive an NWF bias signal. The NWF generator circuit is connected to the high supply voltage rail 116 and the bus 118, and is configured to generate the NWF bias signal, which can be set to different voltages as described below. The NWF generator circuit is a known component, and thus, is not described herein in detail. The substrates (or bodies) of the NMOS pull-down transistors 106 and 108 are connected to the low supply voltage rail 122 to receive VSS.

In this embodiment, the parallel-connected control transistors 110 and 112 are an NMOS transistor and a PMOS transistor, respectively. The NMOS control transistor 110 is connected to the gate of the PMOS pull-up transistor 104 (via a node 124) and the bus 118, and thus, is able to connect the gate of the PMOS pull-up transistor 104 to the bus. Similarly, the PMOS control transistor 112 is connected to the gate of the PMOS pull-up transistor 104 (via the node 124) and the bus 118, and thus, is also able to connect the gate of the PMOS pull-up transistor 104 to the bus. The PMOS control transistor 112 is connected in parallel to the NMOS control transistor 110 between the gate of the PMOS pull-up transistor 104 and the bus. The gates of the NMOS control transistor 110 and the PMOS control transistor 112 are both connected to the high supply voltage rail 116 to receive VDD. The substrate of the NMOS control transistor 110 is connected to the low supply voltage rail 122 to receive VSS. The substrate of the PMOS control transistor 112 is connected to the NWF generator circuit 114 to receive the NWF bias signal.

The pull-up and pull-down modes of operations of the bus holder circuit 100 during normal operating conditions, i.e., when the voltage (VBUS) on the bus 118 is equal to or less than VDD, are now described. The pull-up mode of the bus holder circuit is initiated when a PUP signal of low state (e.g., zero volts) and a PDN signal of low state (e.g., zero volts) are applied to the bus holder circuit. As a result of the applied PUP and PDN signals, the PMOS pull-up transistors 102 and 104 are turned ON (i.e., conducting state) and the gate of the PMOS pull-up transistor 104 is connected to the bus. As the bus is charged through the PMOS pull-up transistors 102 and 104, the voltage VX on the node 124 follows the voltage VBUS on the bus 118 through the NMOS control transistor 110. The maximum voltage on the node 124 is VDD-$V_{TN}$, where $V_{TN}$ is the threshold voltage of the NMOS transistor 110. Hence, the PMOS pull-up transistor 104 is always ON, holding the voltage VBUS on the bus 118 to VDD. The NMOS control transistor 110 will have a body bias when the source connected to the bus is pulled above VSS. The body bias increases the threshold voltage of the NMOS control transistor 110, which provides enough gate overdrive for the PMOS pull-up transistor 104 to remain ON when the voltage VBUS on the bus is pulled to VDD. In the pull-up mode, the NMOS pull-down transistor 108 is turned OFF (i.e., non-conducting state) and remains OFF. Therefore, there is no current path from the bus to the low supply voltage rail 122.

The pull-down mode of the bus holder circuit 100 is initiated when a PUP signal of high state (e.g., VDD) and a PDN signal of low state are applied to the bus holder circuit. As a result of the applied PUP and PDN signals, the NMOS pull-down transistor is turned ON, in addition to the NMOS pull-down transistor 106, and thus, a current path is created from the bus 118 to the low voltage rail 122 to pull down the bus voltage VBUS. However, the PMOS pull-up transistors 102 is turned OFF, and thus, there is no charging path from the high voltage supply rail 116 to the bus 118 in the pull-down mode.

The operation of the bus holder circuit 100 when a high voltage is applied to the bus 118 by an external source (not shown), i.e., when the voltage VBUS on the bus is greater than VDD, is now described. If the voltage VBUS on the bus is pulled higher than VDD by the external source, the PMOS control transistor 112 is turned ON at VBUS=VDD+$V_{TP}$, where $V_{TP}$ is the threshold voltage of the PMOS transistor 112. As a result, the voltage VX on the node 124 is charged to the voltage VBUS on the bus. As the node voltage VX follows the bus voltage VBUS above VDD+$V_{TP}$, the PMOS pull-up transistor 104 turns OFF, cutting off the current path between the bus and the high supply voltage rail 116. Thus, the PMOS transistors 104 and 112 avoid static current independent of the state of the PUP signal when the node voltage VBUS is higher than VDD+$V_{TP}$. In addition, the gate-oxide of the PMOS pull-up transistor 102 is protected in the pull-up mode of the bus holder circuit when the PUP and the PDN signals are both low signals. It is noted here that the voltage VINT on the node 120 will remain at VDD.

In the pull-down mode of the bus holder circuit 100, a high voltage tolerance of the pull-down path, i.e., the path from the bus 118 to the low supply voltage rail 122, is achieved by the cascading NMOS pull-down transistor 106. Since the gate of the NMOS pull-down transistor 106 is connected to VDD, the NMOS pull-down transistor 106 always remains ON and protects the NMOS pull-down transistor 108 when the PDN signal is low and the voltage VBUS on the bus is greater than VDD.

The substrates of the PMOS transistors 104 and 112, which are connected to the bus 118, are switched between VDD and the bus voltage VBUS to avoid forward biasing of the substrate diode between source/drain and VDD.

The substrate of the PMOS pull-up transistor 102 can be connected to receive the NWF bias signal or VDD as the voltage on the node voltage VINT cannot exceed VDD. The NWF generator circuit 114 is configured to generate the NWF bias signal such that, NWF=$V$DD if $V$BUS<=($V$DD+$V_{TP}$), NWF=$V$BUS if $V$BUS>($V$DD+$V_{TP}$).

Figure 2:
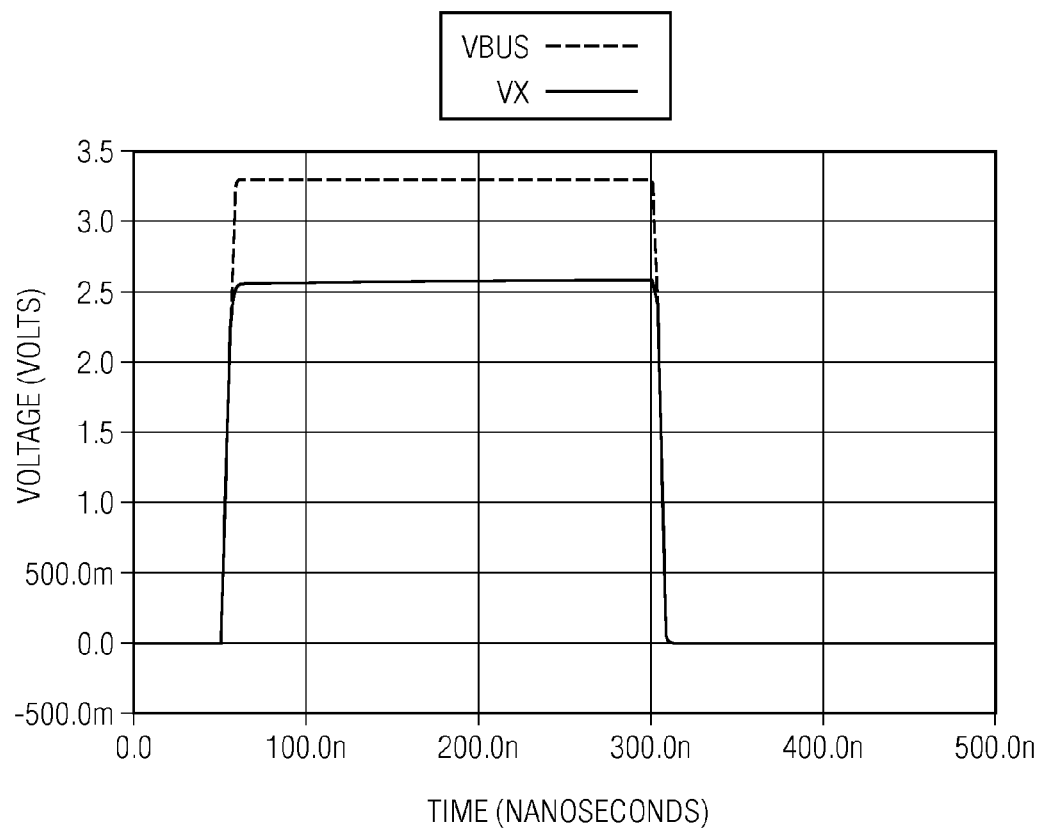
FIG. 2 is a graph of the bus voltage VBUS and the node voltage VX for the bus holder circuit of FIG. 1 during normal mode of operation derived from a circuit simulation.
Figure 3:
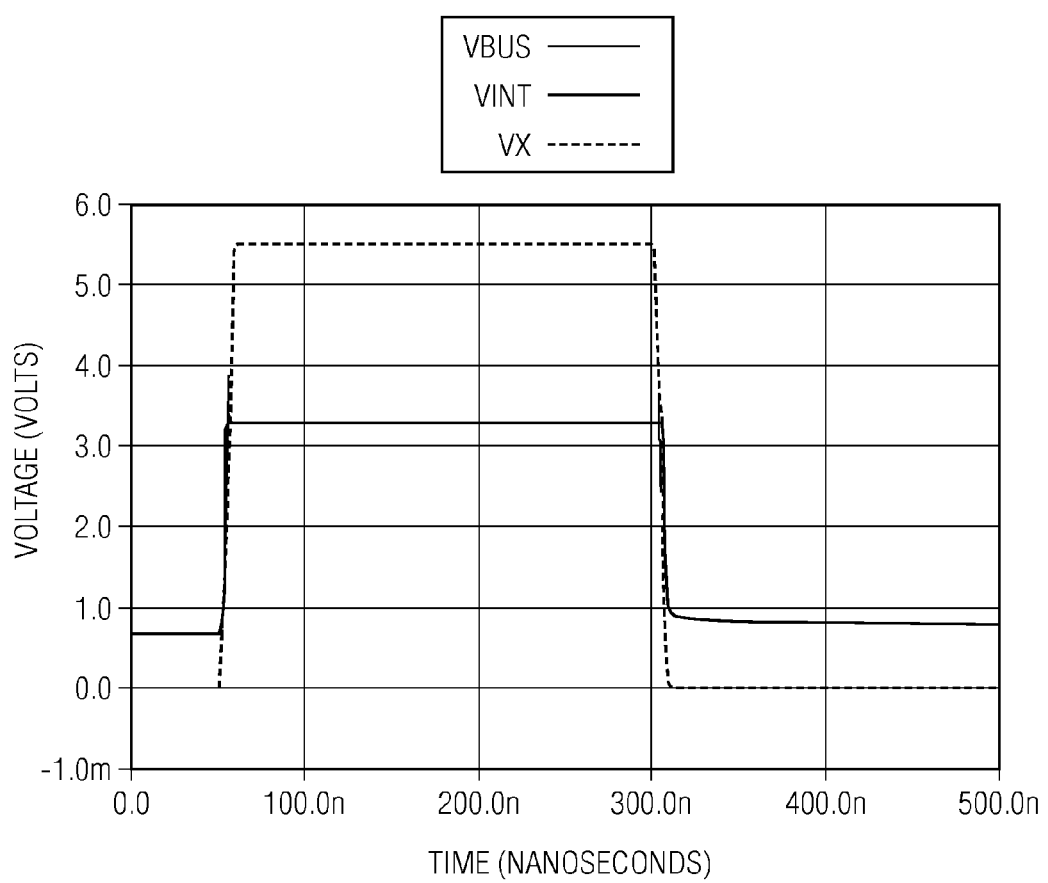
FIG. 3 is a graph of the bus voltage VBUS and the node voltages VX and VINT for the bus holder circuit of FIG. 1 during 5V input on the bus derived from a circuit simulation.
Figure 4:
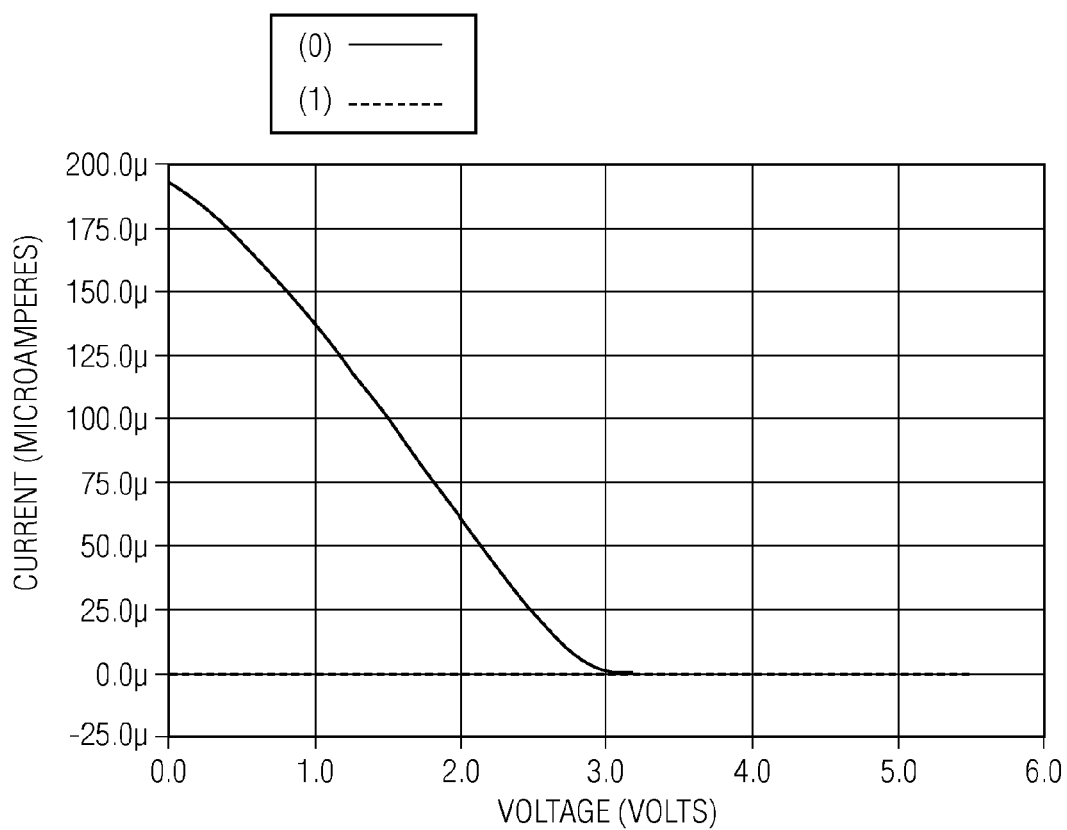
FIG. 4 is a graph of the bus voltage VBUS versus current characteristics for the bus holder circuit of FIG. 1 in high impedance and pull-up mode derived from a circuit simulation.

A circuit simulation of the bus holder circuit 100 was carried out using 3.3V I/O devices in 90 nm CMOS process technology. FIG. 2 shows that in the normal mode of operation, the voltage VX on the node 124 is sufficiently below the supply voltage of 3.3V, and therefore, the PMOS pull-up transistor 104 is ON, holding the voltage VBUS on the bus 118 to VDD. FIG. 3 shows the voltage VX on the node 124 during 5.5V input on the bus 118. The node voltage VX follows the bus voltage VBUS to cut-off static current path between the bus and the high supply voltage rail 116. The voltage VINT on the node 120 is at VDD, and hence, the PMOS pull-up transistors 102 and 104 are not stressed during 5.5V on the bus 118. FIG. 4 shows the bus voltage VBUS versus current characteristics when the bus holder circuit is in high impedance and pull-up mode. In the pull-up mode, as the bus voltage VBUS increases, the current reduces and there is no static current when VBUS>=VDD, as shown in FIG. 4 by the line for (0). Also, in high impedance mode when PUP=VDD and PDN=0, there is no static current, as shown in FIG. 4 by the line for (1).

Figure 5:
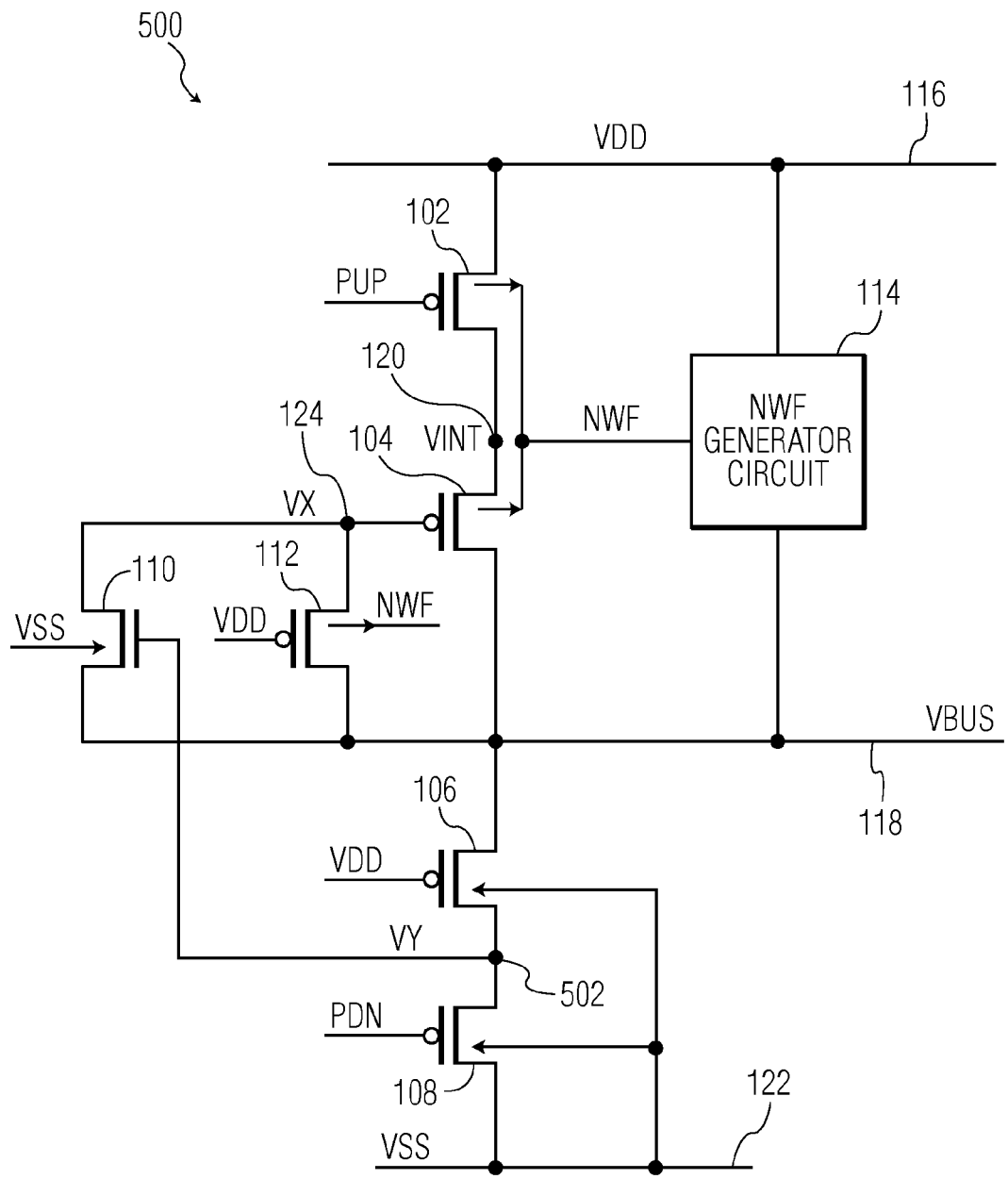
FIG. 5 is a schematic diagram of a high voltage tolerant bus holder circuit in accordance with another embodiment of the invention.

Turning now to FIG. 5, a high voltage tolerant bus holder circuit 500 in accordance with another embodiment of the invention is shown. The bus holder circuit 500 is similar to the bus holder circuit 100 of FIG. 1. As shown in FIG. 5, the bus holder circuit 500 includes all the elements of the bus holder circuit 100. The electrical connections of the elements of the bus holder circuit 500 are the same as the elements of the bus holder circuit 100, except for the NMOS control transistor 110. In the bus holder circuit 500, the gate of the NMOS control transistor 110 is connected to a node 502, which is situated between the NMOS pull-down transistors 106 and 108. Thus, the gate of the NMOS transistor 110 is connected to the source/drain of each of the NMOS pull-down transistors 106 and 108.

The bus holder circuit 500 operates in a manner similar to the bus holder circuit for all conditions. However, in a pull-up/bus holder mode of the bus holder circuit 500, the maximum value for the voltage VY on the node 502 is VDD-$V_{TN}$, where $V_{TN}$ is the threshold voltage for the NMOS transistor 106. In addition, the maximum value for the voltage VX on the node 124 is VDD-2$V_{TN}$. Thus, the PMOS control transistor 112 gets higher gate overdrive and can hold the bus 118 strongly to VDD.

In an application, the bus holder circuit 100 or 500 is used as a programmable bus holder in high voltage tolerant general purpose I/O interfaces for holding the bus to required logic level.

In another application, the bus holder circuit 100 or 500 can be used for implementing high voltage tolerant on-chip switches for device identification. To reduce the pin count and cost, weak pull-up/down resistors used for device speed identification in USB standard are moved inside the chip. These pull-up/down resistors are connected and disconnected from the external bus by using a switch which is controlled by the core signal. The switch used to connect/disconnect the resistor to bus is typically capable of handing of 5.25V according to USB standard. The bus holder circuit 100 or 500 can be used for implementing such high voltage tolerant on-chip switches.

In another application, the bus holder circuit 100 or 500 configured in the pull-up mode can be used in Inter-Integrated Circuit (IIC) interfaces for holding the bus to supply voltage. The open drain I/O interfaces, such as IIC interfaces, use pull-up resistors to hold the bus to valid high level. These pull-up resistors are implemented on the board. The cost of the board can be reduced by moving these resistors inside the chip. To reduce static power consumption, the switches used to connect the pull-up resistor should be high voltage tolerant. The bus holder circuit 100 or 500 can be used in such IIC interfaces.

Figure 6:
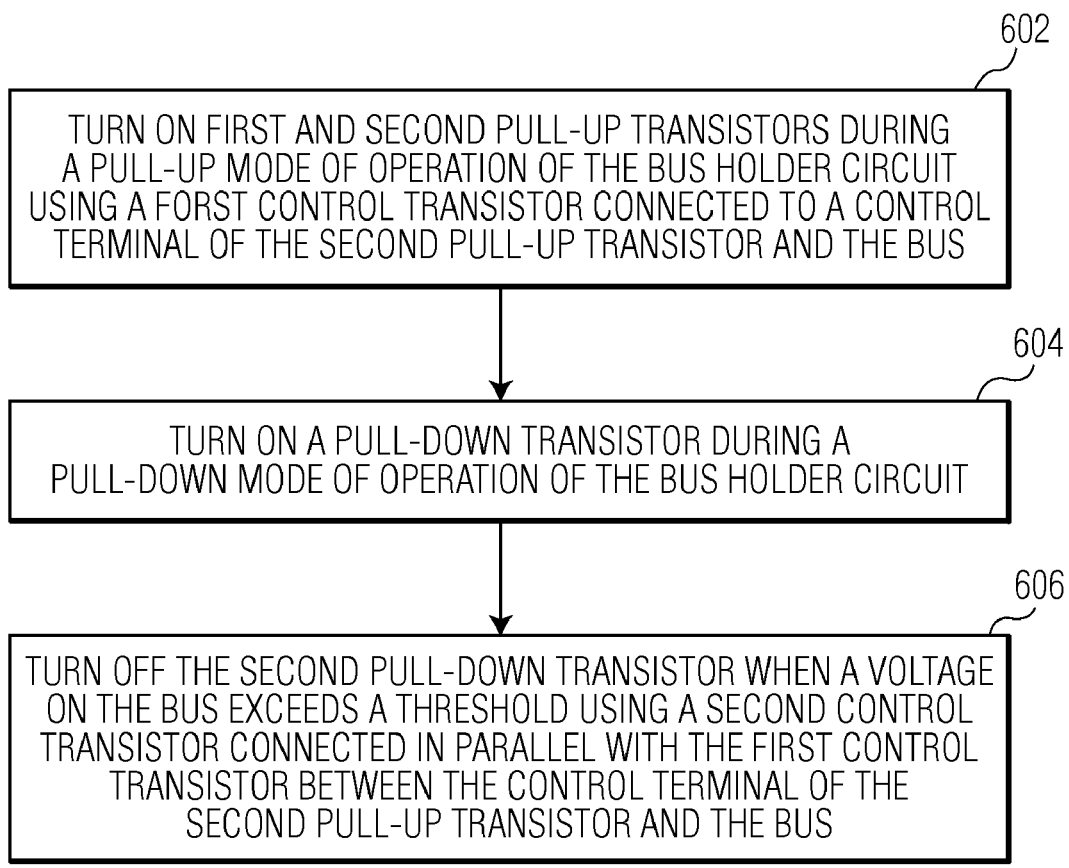
FIG. 6 is a process flow diagram of a method of operating a bus holder circuit in accordance with an embodiment of the invention.

FIG. 6 is a process flow diagram of a method of operating a high voltage tolerant bus holder circuit in accordance with an embodiment of the invention. At block 602, first and second pull-up transistors connected in series on a first current path between a bus and a high voltage rail are turned on during a pull-up mode of operation of the bus holder circuit using a first control transistor connected to a control terminal of the second pull-up transistor and the bus. At block 604, a first pull-down transistor on a second current path between the bus and a low voltage rail is turned off during a pull-down mode of operation of the bus holder circuit. At block 606, the second pull-down transistor is turned off when the voltage on the bus exceeds a threshold using a second control transistor connected in parallel with the first control transistor between the control terminal of the second pull-up transistor and the bus.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A bus holder circuit comprising:
    first and second pull-up transistors connected in series on a first current path between a bus and a high voltage rail;
    a first pull-down transistor on a second current path between the bus and a low voltage rail; and
    first and second control transistors connected in parallel between a control terminal of the second pull-up transistor and the bus, the first control transistor being used to turn on the second pull-up transistor during a pull-up mode of operation, the second control transistor being used to turn off the second pull-up transistor when a voltage on the bus exceeds a threshold.

2. The bus holder circuit of claim 1, further comprising a generator circuit configured to generate a bias signal, the generator circuit being connected to substrates of the first and second pull-up transistors and the second control transistor to supply the bias signal to the substrates.

3. The bus holder circuit of claim 2, wherein the generator circuit is configured to set the bias signal to be equivalent to the voltage on the bus when the voltage on the bus exceeds the threshold or to a voltage on the high voltage terminal when the voltage on the bus does not exceed the threshold.

4. The bus holder circuit of claim 1 further comprising a second pull-down transistor connected in series with the first pull-down transistor on the second current path between the bus and the first pull-down transistor.

5. The bus holder circuit of claim 4, wherein substrates of the first and second pull-down transistors are connected to the low voltage rail.

6. The bus holder circuit of claim 4, wherein a control terminal of the second pull-down transistor is connected to receive a voltage on the high voltage rail.

7. The bus holder circuit of claim 1, wherein control terminals of the first and second control transistors are connected to receive a voltage on the high voltage rail.

8. The bus holder circuit of claim 1, wherein a control terminal of the first control transistor is connected to the second current path between the first pull-down transistor and the bus and wherein a control terminal of the second control transistor is connected to receive a voltage on the high voltage rail.

9. The bus holder circuit of claim 1, wherein control terminals of the first pull-up transistor and the first pull-down transistor are connected to receive control signals to switch the bus holder circuit between the pull-up mode of operation and a pull-down mode of operation.

10. A bus holder circuit comprising:
    first and second pull-up transistors connected in series on a first current path between a bus and a high voltage rail;
    first and second pull-down transistors on a second current path between the bus and a low voltage rail; and
    first and second control transistors connected in parallel between a control terminal of the second transistor and the bus, the first control transistor being used to turn on the second pull-up transistor during a pull-up mode of operation, the second control transistor being used to turn off the second pull-up transistor when a voltage on the bus exceeds a threshold.

11. The bus holder circuit of claim 10, further comprising a generator circuit configured to generate a bias signal, the generator circuit being connected to substrates of the first and second pull-up transistors and the second control transistor to supply the bias signal to the substrates, wherein the generator circuit is configured to set the bias signal to be equivalent to the voltage on the bus when the voltage on the bus exceeds the threshold or to a voltage on the high voltage terminal when the voltage on the bus does not exceed the threshold.

12. The bus holder circuit of claim 10, wherein control terminals of the second pull-down transistor and the first and second control transistors are connected to receive a voltage on the high voltage rail.

13. The bus holder circuit of claim 10, wherein a control terminal of the first control transistor is connected to the second current path between the first and second pull-down transistors and wherein a control terminal of the second control transistor is connected to receive a voltage on the high voltage rail.

14. The bus holder circuit of claim 10, wherein control terminals of the first pull-up transistor and the first pull-down transistor are connected to receive control signals to switch the bus holder circuit between the pull-up mode of operation and a pull-down mode of operation.

15. A method of operating a bus holder circuit, the method comprising:
    turning on first and second pull-up transistors connected in series on a first current path between a bus and a high voltage rail during a pull-up mode of operation of the bus holder circuit using a first control transistor connected to a control terminal of the second pull-up transistor and the bus;
    turning on a first pull-down transistor on a second current path between the bus and a low voltage rail during a pull-down mode of operation of the bus holder circuit; and
    turning off the second pull-down transistor when a voltage on the bus exceeds a threshold using a second control transistor connected in parallel with the first control transistor between the control terminal of the second pull-up transistor and the bus.

16. The method of claim 15, further comprising supplying a bias signal to substrates of the first and second pull-up transistors and the second control transistor, wherein the bias signal is set to be equivalent to the voltage on the bus when the voltage on the bus exceeds the threshold or to be equivalent to a voltage on the high voltage terminal when the voltage on the bus does not exceed the threshold.

17. The method of claim 15, further comprising providing a voltage on the high voltage rail to a control terminal of a second pull-down transistor connected in series with the first pull-down transistor on the second current path between the bus and the first pull-down transistor.

18. The method of claim 15, further comprising providing a voltage on the high voltage rail to control terminals of the first and second control transistors.

19. The method of claim 15, further comprising providing a voltage on the high voltage rail to a control terminal of the second control transistor, wherein a control terminal of the first control transistor is connected to the second current path between the first pull-down transistor and the bus.

20. The method of claim 15, further comprising proving control signals to control terminals of the first pull-up transistor and the first pull-down transistor to switch the bus holder circuit between the pull-up mode of operation and a pull-down mode of operation.

* * * * *